(12) United States Patent
Katayama (10) Patent No.: US 8,711,632 B2
(45) Date of Patent: Apr. 29, 2014

(54) SEMICONDUCTOR MEMORY DEVICE (75) Inventor: Akira Katayama, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 13/425,860

(22) Filed: Mar. 21, 2012

(65) Prior Publication Data

US 2012/0250400 A1 Oct. 4, 2012

(30) Foreign Application Priority Data

Mar. 30, 2011 (JP) ................................. 2011-075562

(51) Int. Cl.
*G11C 11/34* (2006.01)

(52) U.S. Cl.
USPC .................. 365/185.2; 365/205; 365/185.21; 365/210.1; 365/225.5

(58) Field of Classification Search
USPC ............ 365/185.21, 205, 185.2, 210.1, 225.5
See application file for complete search history.

(56) References Cited

U.S. PATENT DOCUMENTS

2003/0081461 A1* 5/2003 Yamauchi et al. ....... 365/189.09

OTHER PUBLICATIONS

Kenji Tsuchida, et al., "A 64Mb MRAM with Clamped-Reference and Adequate-Reference Schemes", ISSCC Digest of Technical Papers, 2010 IEEE International Solid-State Circuits Conference, Feb. 7-11, 2010, pp. 258-259.

* cited by examiner

*Primary Examiner* — Jason Lappas
(74) *Attorney, Agent, or Firm* — Oblon, Spivak, McClelland, Maier & Neustadt, L.L.P.

(57) ABSTRACT

The control circuit selects, as the first reference cell, the first memory cell having a maximum reading current supplied by turning on the first select transistor in a state in which resistance values of the first memory cells are all increased. The control circuit selects, as the second reference cell, the second memory cell having a maximum reading current supplied by turning on the second select transistor in a state in which resistance values of the second memory cells are all increased. The first reference-current setting circuit sets, as the first reference current, a current obtained by adding a first adjusting current to the reading current of the first reference cell. The second reference-current setting circuit sets, as the second reference current, a current obtained by adding a second adjusting current to the reading current of the second reference cell.

19 Claims, 5 Drawing Sheets

SEMICONDUCTOR MEMORY DEVICE

CROSS-REFERENCE TO RELATED APPLICATION

This application is based upon and claims the benefit of priority from the prior Japanese Patent Application No. 2011-075562, filed on Mar. 30, 2011, the entire contents of which are incorporated herein by reference.

BACKGROUND

1. Field

Embodiments described herein relate generally to a semiconductor memory device such as MRAM (Magnetic Random Access Memory).

2. Background Art

In recent years, as semiconductor integrated circuits have higher packing densities and lower power supply voltages, memory cells may have more operating margin faults in MRAM memory macros.

For example, an MRAM cell includes a storage element and a transistor. The MRAM cell is connected to a word line and a bit line.

A reading operation of data in such an MRAM cell requires a signal from a reference bit line for comparison with a signal from the bit line connected to the MRAM cell to be read.

In some methods, a signal from a reference bit line is the mean value of two different states held in at least two storage elements.

In other methods, multiple MRAM memory arrays are prepared for signal candidates of reference bit lines. One of the reference bit lines is selected so as to have a maximum reading margin and then the signal of the selected bit line is used.

DETAILED DESCRIPTION

A semiconductor memory device according to an embodiment comprises a first cell array including first memory cells arranged in a matrix, the first memory cell having a first variable resistance element and a first select transistor. The semiconductor memory device comprises a second array including second memory cells arranged in a matrix, the second memory cell having a second variable resistance element and a second select transistor. The semiconductor memory device comprises a first reference-current setting circuit that outputs a first reference current based on a current passing through a first reference cell selected for reference from the first memory cells of the first cell array. The semiconductor memory device comprises a second reference-current setting circuit that outputs a second reference current based on a current passing through a second reference cell selected for reference from the second memory cells of the second cell array. The semiconductor memory device comprises a sense amplifier circuit that compares a current passing through a selected bit line and the second reference current and outputs a first reading signal according to a comparison result when the selected first memory cell of the first cell array is read, and compares a current passing through a selected bit line and the first reference current and outputs a second reading signal according to a comparison result when the selected second memory cell of the second cell array is read. The semiconductor memory device comprises a control circuit that controls the first and second reference-current setting circuits.

The control circuit selects, as the first reference cell from the first cell array, the first memory cell having a maximum reading current supplied by turning on the first select transistor in a state in which resistance values of the first memory cells are all increased.

The control circuit selects, as the first reference cell, the first memory cell being capable of passing a maximum reading current supplied by turning on the first select transistor.

The control circuit selects, as the second reference cell, the second memory cell being capable of passing a maximum reading current supplied by turning on the second select transistor.

The first reference-current setting circuit sets, as the first reference current, a current obtained by adding a first adjusting current to the reading current of the first reference cell.

The second reference-current setting circuit sets, as the second reference current, a current obtained by adding a second adjusting current to the reading current of the second reference cell.

As semiconductor integrated circuits have higher packing densities and lower power supply voltages, memory cells may have more operating margin faults in MRAM memory macros.

The following embodiment proposes a method of improving a reading margin for data in an MRAM cell.

The embodiment will be described below with reference to the accompanying drawings.

First Embodiment

Figure 1:
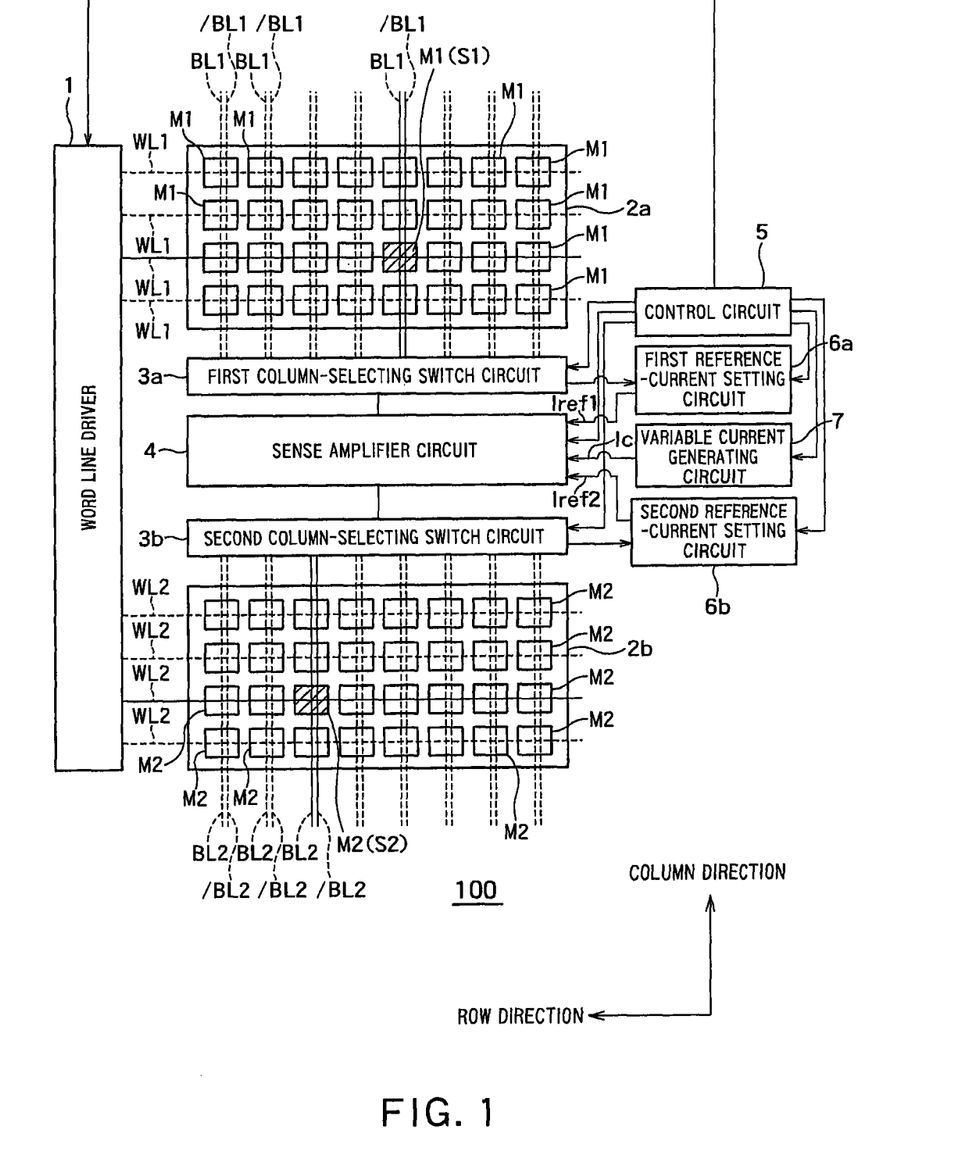
FIG. 1 is a diagram showing an example of the configuration of a semiconductor memory device 100 according to a first embodiment.

FIG. 1 illustrates an example of the configuration of a semiconductor memory device 100 according to a first embodiment.

In the semiconductor memory device (e.g., a spin-transfer MRAM) 100 of FIG. 1, memory cells M1 and M2 are used that store binary logics ("0" or "1") according to the resistance value of a variable resistance element R.

As illustrated in FIG. 1, the semiconductor memory device 100 includes multiple word lines WL1 and WL2, multiple bit lines BL1, /BL1, BL2, and /BL2, a word line driver 1, a first cell array 2a, a second cell array 2b, a first column-selecting switch circuit 3a, a second column-selecting switch circuit 3b, a sense amplifier circuit 4, a control circuit 5, a first reference-current setting circuit 6a, a second reference-current setting circuit 6b, and a variable current generating circuit 7.

The word lines WL1 and WL2 are arranged in a row direction. The bit lines BL1, /BL1, BL2, and /BL2 are arranged in a column direction.

In the first cell array 2a, the first memory cells M1 are arranged in a matrix fashion, each of which contains the variable resistance element R and a select transistor Tr that are connected in series between the different bit lines BL1 and /BL1.

In the second cell array 2b, the second memory cells M2 are arranged in a matrix fashion, each of which contains the variable resistance element R and the select transistor Tr that are connected in series between the different bit lines BL2 and /BL2.

Figure 2:
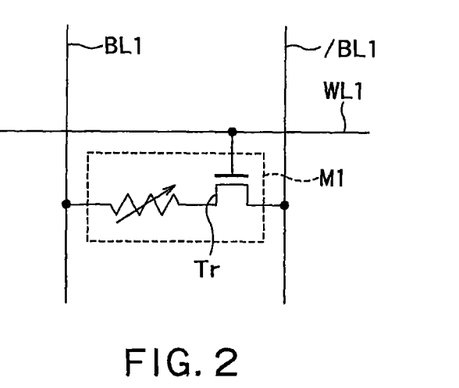
FIG. 2 is a diagram showing an example of a specific configuration of the memory cell M1 in FIG. 1.

FIG. 2 illustrates an example of a specific configuration of the memory cell M1 in FIG. 1.

As illustrated in FIG. 2, the select transistor Tr is an MOS transistor. The control terminal (gate) of the select transistor Tr is connected to the word line WL1. The current path of the select transistor Tr has one end connected to the bit line /BL and the other end connected to the variable resistance element R. In the present embodiment, one end (source) of the select transistor Tr is connected to the bit line BL. The variable resistance element R is connected between the other end (drain) of the select transistor Tr and the bit line /BL.

The variable resistance element R is connected in series with the select transistor Tr between the bit line BL and the bit line /BL. The resistance value of the variable resistance element R varies according to a flowing current.

The memory cell M2 in FIG. 1 is identical in configuration to the memory cell M1 illustrated in FIG. 2.

In the case where a potential difference between the bit line BL and the bit line /BL causes a first polarity current of at least a first inversion threshold current to pass through, the variable resistance element R has a first resistance value. In the case where a current of at least a second inversion threshold current passes through a second polarity that is different from a first polarity because of a potential difference between the bit line BL and the bit line /BL, the variable resistance element R has a second resistance value.

In other words, the resistance value of the variable resistance element R changes when a current of at least a predetermined value passes through the variable resistance element R. In the present embodiment, the variable resistance element R is a magnetoresistive element (e.g., an MTJ element).

Figure 3:
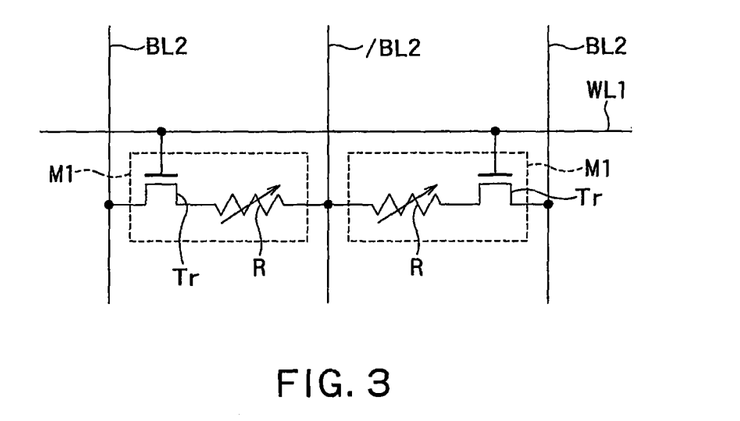
FIG. 3 is a diagram showing an example of a specific configuration of the two memory cells M1 that share the bit line /BL of FIG. 1.

For example, the two adjacent memory cells M1 connected to the same word line WL1 may share the single bit line. FIG. 3 illustrates an example of a specific configuration of the two memory cells M1 that share the bit line /BL of FIG. 1.

For example, as illustrated in FIG. 3, the two adjacent memory cells M1 connected to the same word line WL1 share the single bit line /BL.

Moreover, the two adjacent memory cells M2 connected to the same word line WL2 in FIG. 1 may share the single bit line as the memory cells M1 of FIG. 3.

As illustrated in FIG. 1, the word line driver 1 controls the voltages of the word lines WL1 and WL2 connected to the control terminals (gates) of the select transistors Tr. The select transistors Tr are turned on/off by controlling the voltages of the word lines WL1 and WL2.

The first column-selecting switch circuit 3a is connected to the bit lines BL1 and /BL1 that are connected to the first memory cells M1 of the first cell array 2a. For example, the first column-selecting switch circuit 3a selects a pair of the bit lines BL1 and /BL1 connected to one of the first memory cells M1.

The second column-selecting switch circuit 3b is connected to the bit lines BL2 and /BL2 that are connected to the second memory cells M2 of the second cell array 2b. For example, the second column-selecting switch circuit 3b selects a pair of the bit lines BL2 and /BL2 connected to one of the second memory cells M2.

The first reference-current setting circuit 6a outputs a first reference current Iref1 to the sense amplifier circuit 4 based on a current passing through a first reference cell (S1 in FIG. 1) having been selected for reference out of the first memory cells M1 of the first cell array 2a.

The second reference-current setting circuit 6b outputs a second reference current Iref2 to the sense amplifier circuit 4 based on a current passing through a second reference cell (S2 in FIG. 1) having been selected for reference out of the second memory cells M2 of the second cell array 2b.

In a reading operation of the selected first memory cell M1 of the first cell array 2a, the sense amplifier circuit 4 compares a current passing through the bit lines BL1 and /BL1 selected by the first column-selecting switch circuit 3a and the second reference current Iref2 and outputs a first reading signal according to the comparison result. A logic stored in the first memory cell M1 is determined based on the first reading signal.

Furthermore, in a reading operation of the selected second memory cell M2 of the second cell array 2b, the sense amplifier circuit 4 compares a current passing through the bit lines BL2 and /BL2 selected by the second column-selecting switch circuit 3b and the first reference current Iref1 and outputs a second reading signal according to the comparison result. A logic stored in the second memory cell M2 is determined based on the second reading signal.

The variable current generating circuit 7 outputs a variable comparison current Ic.

The control circuit 5 controls the word line driver 1, the first and second column-selecting switch circuits 3a and 3b, the sense amplifier circuit 4, the first and second reference-current setting circuits 6a and 6b, and the variable current generating circuit 7.

Figure 4:
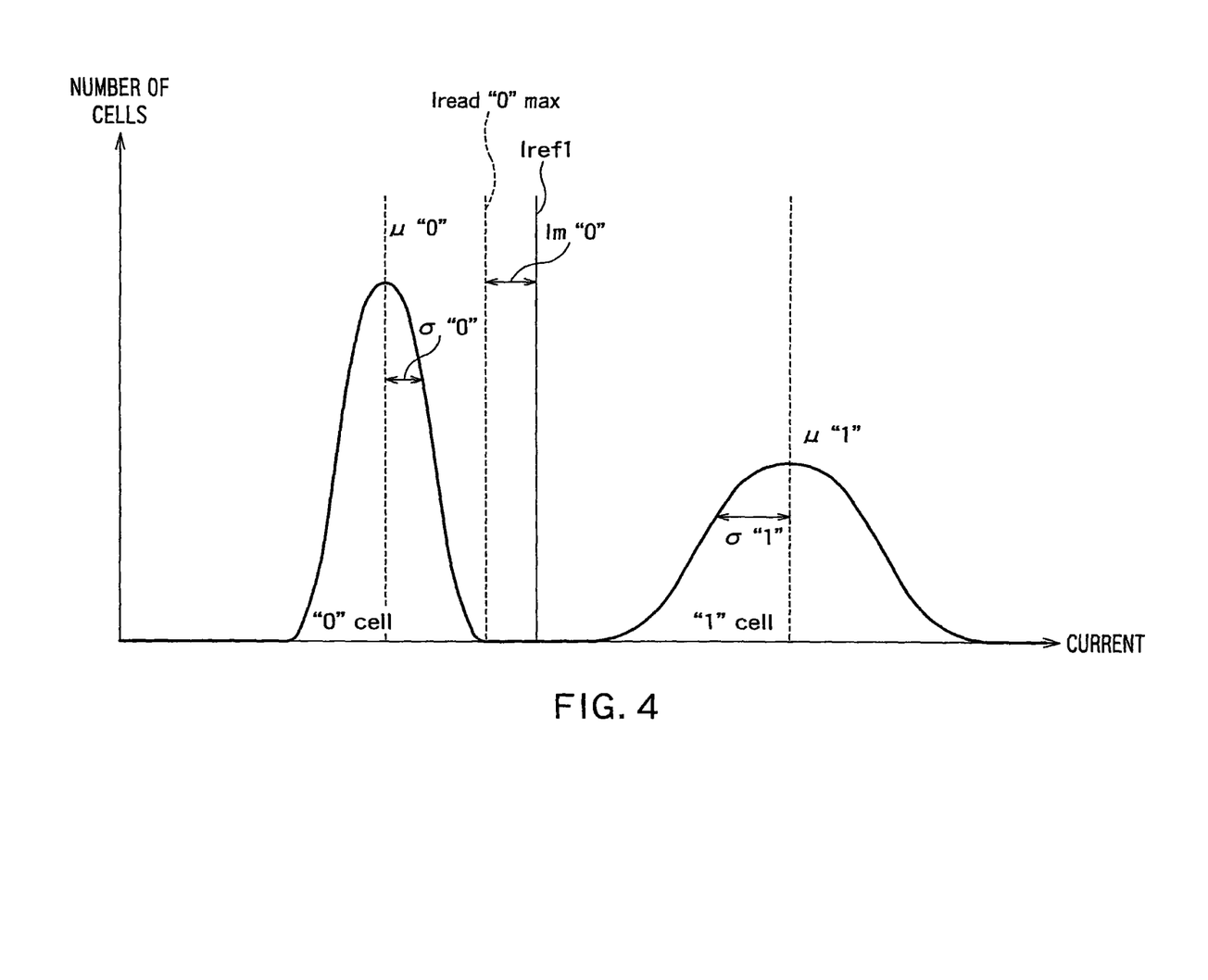
FIG. 4 is a diagram showing an example in which the reference current is set from the distribution of reading currents supplied when the memory cells containing the logic "0" are read in the memory cell array of the semiconductor memory device 100 illustrated in FIG. 1.
Figure 5:
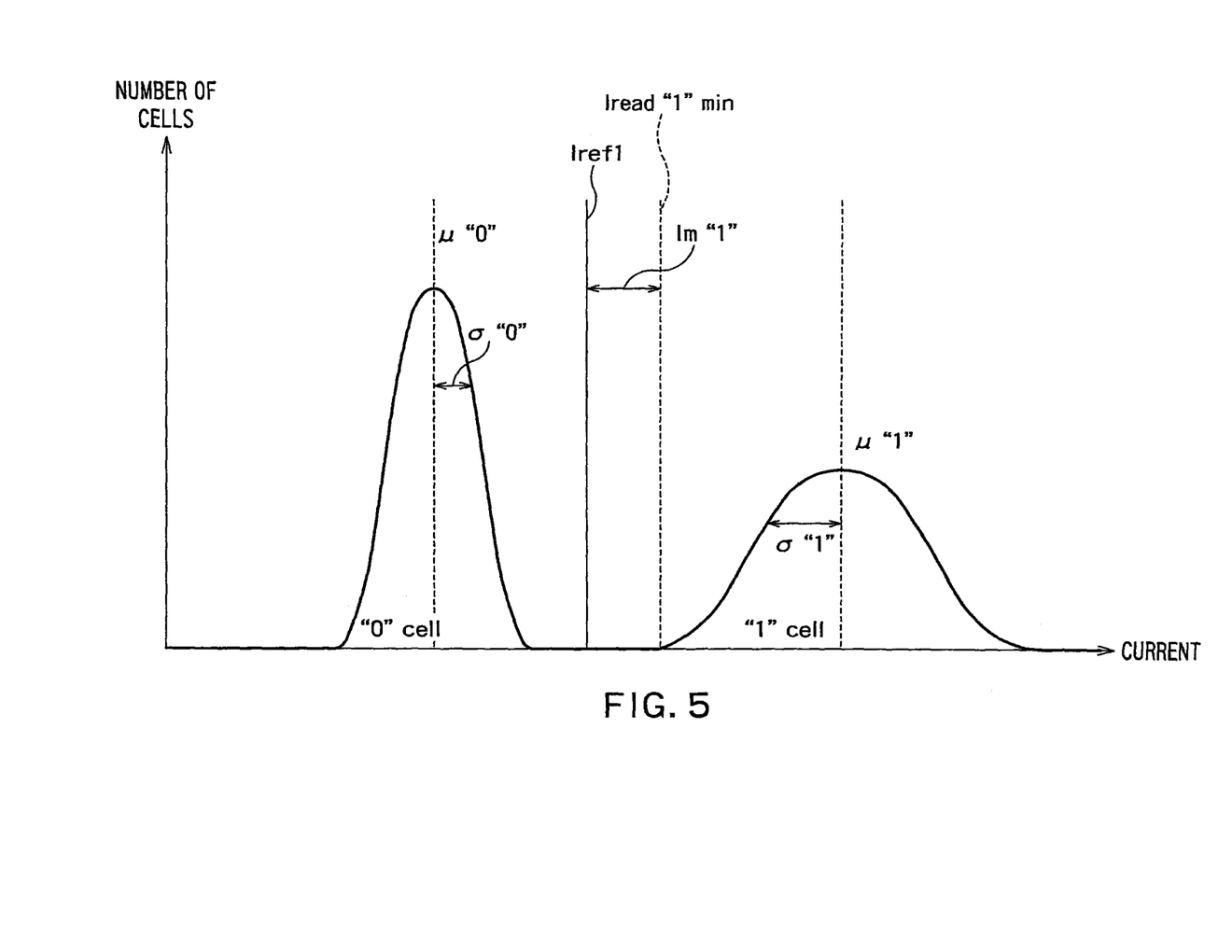
FIG. 5 is a diagram showing an example in which a reference current is set from the distribution of reading currents supplied when the memory cells containing the logic "1" are read in the memory cell array of the semiconductor memory device 100 illustrated in FIG. 1.
Figure 6:
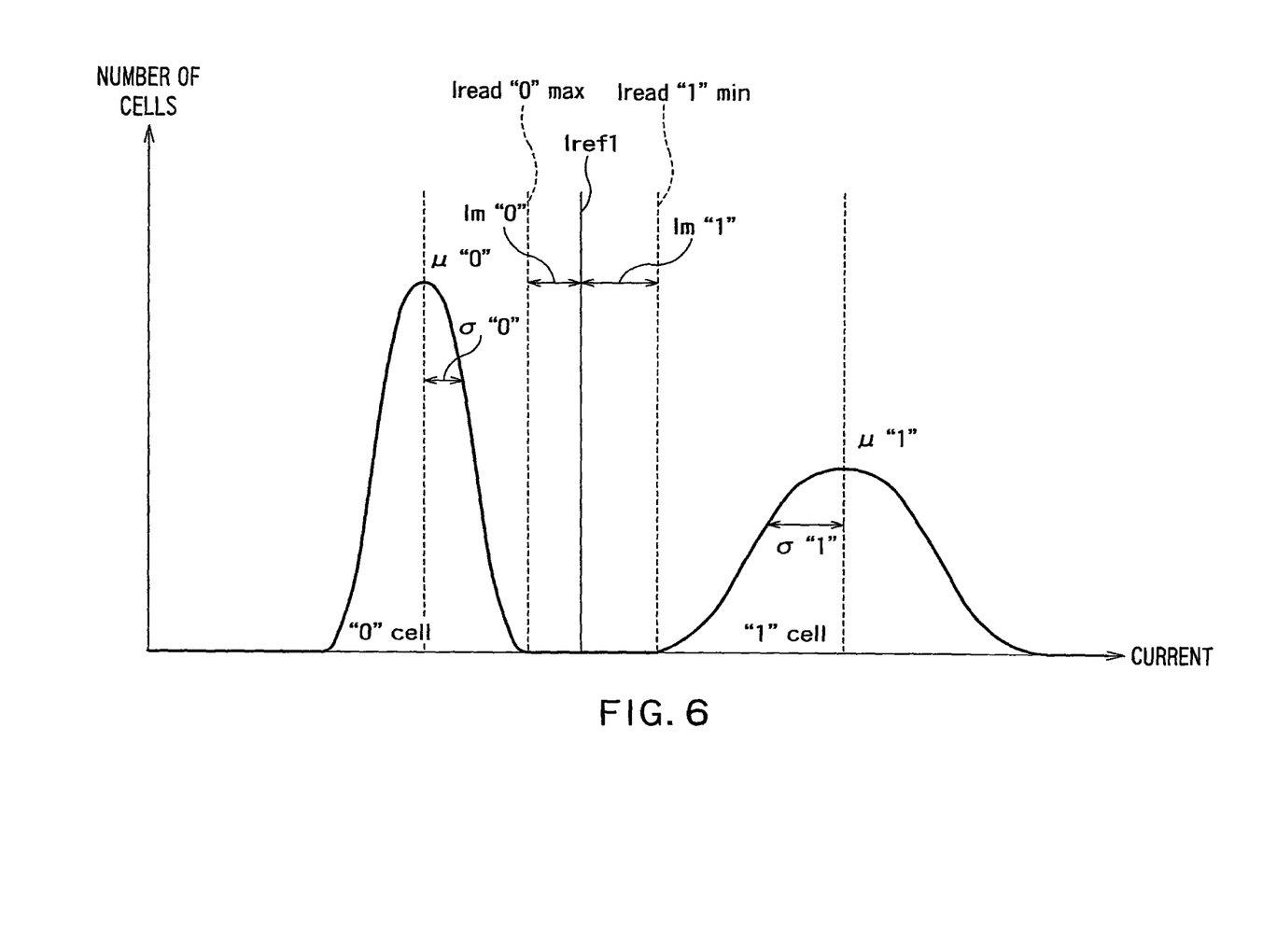
FIG. 6 is a diagram showing an example in which a reference current is set from the distribution of reading currents supplied when the memory cells containing the logic "0" are read in the memory cell array of the semiconductor memory device 100 illustrated in FIG. 1 and the distribution of reading currents supplied when the memory cells containing the logic "1" are read.

The following will describe an example of an operation of setting the reference current of the semiconductor memory device 100 configured thus. FIGS. 4 to 6 illustrate the setting of the first reference current Iref1 as an example. The second reference current Iref2 is similarly set.

A first example is the setting of the reference current from the distribution of reading currents supplied when the memory cells containing the logic "0" in the memory cell array are read.

For example, the control circuit 5 controls the word line driver 1, the first column-selecting switch circuit 3a, and the sense amplifier circuit 4 such that the same logic (e.g., "0") for increasing a resistance value is stored in all of the first memory cells M1.

In this state, the control circuit 5 controls the word line driver 1, the first column-selecting switch circuit 3a, the sense amplifier circuit 4, and the variable current generating circuit 7 to gradually increase the comparison current Ic, and causes the sense amplifier circuit 4 to compare the comparison current Ic and reading currents supplied by turning on the select transistors Tr.

Based on the comparison results, the control circuit 5 selects the first memory cell M1 having a maximum reading current supplied by turning on the select transistor Tr, as the first reference cell S1 from the first cell array 2a (In FIG. 4 described below, the first memory cell M1 having a current Iread"0"max is selected as the first reference cell S1). In other words, the memory cell continuously turned on is selected as the first reference cell. S1 out of the memory cells of the first cell array 2a while the comparison current Ic is gradually increased.

Finally, the first reference-current setting circuit 6a sets, as the first reference current Iref1, a current obtained by adding a first adjusting current (adding an adjusting current Im"0" in FIG. 4 described below) to the reading current of the first reference cell S1.

The control circuit 5 controls the word line driver 1, the second column-selecting switch circuit 3b, and the sense amplifier circuit 4 such that the same logic (e.g., "0") for increasing a resistance value is stored in all of the second memory cells M2.

In this state, the control circuit 5 controls the word line driver 1, the second column-selecting switch circuit 3b, the sense amplifier circuit 4, and the variable current generating circuit 7 to gradually increase the comparison current Ic and causes the sense amplifier circuit 4 to compare the comparison current Ic and reading currents supplied by turning on the select transistors Tr.

Based on the comparison results, the control circuit 5 selects the second memory cell M2 having a maximum reading current supplied by turning on the select transistor Tr, as the second reference cell S2 from the second cell array 2b (In FIG. 4 described below, the second memory cell M2 having the current Iread"0"max is selected as the second reference cell S2). In other words, the memory cell continuously turned on is selected as the second reference cell S2 out of the memory cells of the second cell array 2b while the comparison current Ic is gradually increased.

Finally, the second reference-current setting circuit 6b sets, as the second reference current Iref2, a current obtained by adding a second adjusting current (adding the adjusting current Im"0" in FIG. 4 described below) to the reading current of the second reference cell S2.

FIG. 4 shows an example in which the reference current is set from the distribution of reading currents supplied when the memory cells containing the logic "0" are read in the memory cell array of the semiconductor memory device 100 illustrated in FIG. 1.

As shown in FIG. 4, the maximum reading current Iread"0"max is extracted from reading currents in a state in which the logic "0" for reducing a resistance value is stored in all of the first memory cells M1 of the first memory cell array 2a. Moreover, a current obtained by adding the predetermined adjusting current Im"0" to the maximum reading current Iread"0"max is set as the first reference current Iref1.

In this way, the first reference current Iref1 can be set larger than the maximum value of the reading current distribution of the first memory cells M1 containing the logic "0". Thus, the memory cells containing the logic "0" can be more reliably read.

For example, in a comparative example, an intermediate current between the reading current of a memory cell containing the logic "0" and the reading current of a memory cell containing the logic "1" is set as a reference current. Since the generated reference current has a distribution, a reading margin may decrease in this comparative example.

In the foregoing example of FIG. 4, however, the reference current can be reliably set larger than the maximum value of the reading current distribution of the first memory cells M1 containing the logic "0". In the present embodiment, the first reference current Iref1 can be set smaller than that of the comparative example.

As a result, the first reference current Iref1 can be set at a more proper value so as to increase a reading margin.

The following will describe an example in which a reference current is set from the distribution of reading currents supplied when the memory cells containing the logic "1" in the memory cell array are read.

For example, the control circuit 5 controls the word line driver 1, the first column-selecting switch circuit 3a, and the sense amplifier circuit 4 such that the same logic (e.g., "1") for reducing a resistance value is stored in all of the first memory cells M1.

In this state, the control circuit 5 controls the word line driver 1, the first column-selecting switch circuit 3a, the sense amplifier circuit 4, and the variable current generating circuit 7, and causes the sense amplifier circuit 4 to compare the comparison current Ic and reading currents supplied by turning on the select transistors Tr.

Based on the comparison results, the control circuit 5 selects the first memory cell M1 having a minimum reading current as the first reference cell S1 from the first cell array 2a.

Finally, the first reference-current setting circuit 6a sets, as the first reference current Iref1, a current obtained by subtracting the first adjusting current from the reading current of the first reference cell S1.

Furthermore, the control circuit 5 controls the word line driver 1, the second column-selecting switch circuit 3b, and the sense amplifier circuit 4 such that the same logic (e.g., "1") for reducing a resistance value is stored in all of the second memory cells M2.

In this state, the control circuit 5 controls the word line driver 1, the second column-selecting switch circuit 3b, the sense amplifier circuit 4, and the variable current generating circuit 7, and causes the sense amplifier circuit 4 to compare the comparison current Ic and reading currents supplied by turning on the select transistors Tr.

Based on the comparison results, the control circuit 5 selects the second memory cell M2 having a minimum reading current as the second reference cell S2 from the second cell array 2b.

Finally, the second reference-current setting circuit 6b sets, as the second reference current Iref2, a current obtained by subtracting the second adjusting current from the reading current of the second reference cell S2.

FIG. 5 shows an example in which a reference current is set from the distribution of reading currents supplied when the memory cells containing the logic "1" are read in the memory cell array of the semiconductor memory device 100 illustrated in FIG. 1.

As shown in FIG. 5, a minimum reading current Iread"1"min is extracted from reading currents in a state in which the logic "1" for increasing a resistance value is stored in all of the first memory cells M1 of the first memory cell array 2a. A current obtained by subtracting a predetermined adjusting current Im"1" from the minimum reading current Iread"1"min may be set as the first reference current Iref1.

In this way, the first reference current Iref1 can be set larger than the maximum value of the reading current distribution of the memory cells containing the logic "1". Thus, the memory cells containing the logic "1" can be more reliably read.

In the example of FIG. 5, as described above, the reference current can be reliably set larger than the maximum value of the reading current distribution of the memory cells containing the logic "1". In the present embodiment, the first reference current Iref1 can be set larger than that of the comparative example.

Hence, the memory cells containing the logic "0" can be more reliably read.

As a result, the reference current Iref can be set at a more proper value so as to increase a reading margin.

Finally, the following will describe an example in which a reference current is set from the distribution of reading currents supplied when the memory cells containing the logic "0" are read in the memory cell array and the distribution of reading currents supplied when the memory cells containing the logic "1" are read.

The first reference-current setting circuit 6a sets, as the first reference current Iref1, a current between a first reading current of the first memory cell M1 having a maximum reading current and a second reading current of the first memory cell M1 having a minimum reading current. The maximum reading current is a current supplied by turning on the select transistor Tr in a state in which the same first logic (e.g., "0") for increasing a resistance value is stored in all of the first memory cells M1. The minimum reading current is a current supplied by turning on the select transistor Tr In a state in which a second logic (e.g., "1") for reducing a resistance value is stored in all of the first memory cells M1.

The first reference-current setting circuit 6a sets the first reference current Iref1 based on a ratio of a first standard deviation of the distribution of the first reading currents and a second standard deviation of the distribution of the second reading currents.

For example, the first reference current Iref1 is set such that a ratio of a difference between the first reference current Iref1 and the first reading current and a difference between the first reference current Iref1 and the second reading current is equal to the ratio of the first standard deviation and the second standard deviation.

The second reference-current setting circuit 6b sets, as the second reference current Iref2, a current between a third reading current of the second memory cell M2 having a maximum reading current and a fourth reading current of the second memory cell M2 having a minimum reading current. The third reading current is a current supplied by turning on the select transistor Tr in a state in which the same first logic (e.g., "0") is stored in all of the second memory cells M2. The fourth reading current is a current supplied by turning on the select transistor Tr in a state in which the second logic (e.g., "1") is stored in all of the second memory cells M2.

The second reference-current setting circuit 6b sets the second reference current Iref2 based on a ratio of a third standard deviation of the distribution of the third reading currents and a fourth standard deviation of the distribution of the fourth reading currents.

For example, the second reference current Iref2 is set such that a ratio of a difference between the second reference current Iref2 and the third reading current and a difference between the second reference current Iref2 and the fourth reading current is equal to the ratio of the third standard deviation and the fourth standard deviation.

FIG. 6 shows an example in which a reference current is set from the distribution of reading currents supplied when the memory cells containing the logic "0" are read in the memory cell array of the semiconductor memory device 100 illustrated in FIG. 1 and the distribution of reading currents supplied when the memory cells containing the logic "1" are read.

As shown in FIG. 6, the minimum reading current Iread"1"min is extracted from reading currents supplied in a state in which the logic "1" for increasing a resistance value is stored in all of the first memory cells M1 of the first memory cell array 2a. Moreover, the maximum reading current Iread"0"max is extracted from reading currents supplied in a state in which the logic "0" for reducing a resistance value is stored in all of the first memory cells M1 of the first memory cell array 2a. A current between the minimum reading current Iread"1"min and the maximum reading current Iread"0"max may be set as the first reference current Iref1.

In this way, the first reference current Iref1 can be set smaller than the minimum value of the reading current distribution (standard deviation $\rho$"1") of the first memory cells M1 containing the logic "1" and larger than the maximum value of the reading current distribution (standard deviation $\rho$"0") of the first memory cells M1 containing the logic "0". Thus, the memory cells containing the logic "1" or "0" can be more reliably read.

Particularly, in the example of FIG. 6, a ratio of the difference Im"0" between the first reference current Iref and the reading current Iread"0"max and the difference Im"1" between the reference current Iref and the reading current Iread"1"min is set at the ratio of the standard deviation $\rho$"0" and the standard deviation $\rho$"1".

As a result, the first reference current Iref1 can be set at a more proper value so as to increase a reading margin.

As described above, when the first memory cell M1 is read, the second reference current Iref2 and the reading current of the first memory cell M1 are compared with each other. When the second memory cell M2 is read, the first reference current Iref1 and the reading current of the second memory cell M2 are compared with each other.

In other words, the reference current generated from the reading current distribution of one of the cell arrays is used for reading the other cell array.

The first cell array 2a and the second cell array 2b are, however, formed by the same process and have an identical reading current distribution.

Hence, it is considered that a reference current can be set at a more proper value even in the case where the reference current used for reading a cell array is generated from the reading current distribution of another cell array as in the present embodiment.

As described above, the semiconductor memory device of the first embodiment can improve a reading margin for data.

Moreover, the present embodiment can eliminate the need for providing another memory cell for a reference current, thereby reducing a circuit area.

Furthermore, the memory cell selected as the reference cell is replaced with a redundancy cell (not shown) by a typical redundancy technique and is excluded from reading and writing of data.

In the present embodiment, a binary logic is stored in the memory cell. Also in the case where a multivalued logic is stored in the memory cell, a reference current is set for a set of adjacent values under the same conditions as the binary logic, achieving the same effect.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first cell array including first memory cells arranged in a matrix, the first memory cell having a first variable resistance element and a first select transistor;

a second array including second memory cells arranged in a matrix, the second memory cell having a second variable resistance element and a second select transistor;
a first reference-current setting circuit configured to output a first reference current based on a current passing through a first reference cell selected from the first cell array;
a second reference-current setting circuit configured to output a second reference current based on a current passing through a second reference cell selected from the second cell array;
a sense amplifier circuit configured to compare a current passing through a selected bit line to the second reference current during a first read operation of the first memory cell selected from the first cell array, the sense amplifier circuit being configured to output a first reading signal according to a comparison result during the first read operation, the sense amplifier circuit being configured to compare a current passing through a selected bit line to the first reference current during a second read operation of the second memory cell selected from the second cell array, the sense amplifier circuit being configured to output a second reading signal according to a comparison result during the second read operation; and
a control circuit that controls the first and second reference-current setting circuits,
wherein the control circuit selects, as the first reference cell, the first memory cell being capable of passing a maximum reading current supplied by turning on the first select transistor,
the control circuit selects, as the second reference cell, the second memory cell being capable of passing a maximum reading current supplied by turning on the second select transistor,
the first reference-current setting circuit sets, as the first reference current, a current obtained by adding a first adjusting current to the reading current of the first reference cell, and
the second reference-current setting circuit sets, as the second reference current, a current obtained by adding a second adjusting current to the reading current of the second reference cell.

2. The semiconductor memory device according to claim 1, further comprising a variable current generating circuit configured to output a comparison current,
wherein the control circuit causes the sense amplifier circuit to compare the comparison current and a reading current supplied by turning on the first select transistor, and selects the first memory cell being capable of passing the maximum reading current as the first reference cell from the first cell array based on the comparison result, and
the control circuit causes the sense amplifier circuit to compare the comparison current and a reading current supplied by turning on the second select transistor, and selects the second memory cell being capable of passing the maximum reading current as the second reference cell from the second cell array based on the comparison result.

3. The semiconductor memory device according to claim 1, wherein,
in a case where a first polarity current of at least a first inversion threshold current to pass through the variable resistance element, the variable resistance element has a first resistance value, and in a case where a second polarity current of at least a second inversion threshold current passes through the variable resistance element and the second polarity that is different from the first polarity, the variable resistance element has a second resistance value.

4. The semiconductor memory device according to claim 2, wherein the sense amplifier circuit is connected to the first reference-current setting circuit, the second reference-current setting circuit, and the variable current generating circuit.

5. The semiconductor memory device according to claim 4, wherein the variable resistance element is an MTJ element.

6. The semiconductor memory device according to claim 1,
wherein the first select transistor has a gate connected to a word line, has a first end connected to a first end of the first variable resistance element, and has a second end connected to a first bit line,
wherein the second select transistor has a gate connected to the word line, has a first end connected to a first end of the second variable resistance element, and has a second end connected to a second bit line, and
wherein a second end of the first variable resistance element and a second end of the second variable resistance element are connected to a third bit line.

7. A semiconductor memory device comprising:
a first cell array including first memory cells arranged in a matrix, the first memory cell having a first variable resistance element and a first select transistor;
a second array including second memory cells arranged in a matrix, the second memory cell having a second variable resistance element and a second select transistor;
a first reference-current setting circuit configured to output a first reference current based on a current passing through a first reference cell selected from the first cell array;
a second reference-current setting circuit configured to output a second reference current based on a current passing through a second reference cell selected from the second cell array;
a sense amplifier circuit configured to compare a current passing through a selected bit line to the second reference current during a first read operation of the first memory cell selected from the first cell array, the sense amplifier circuit being configured to output a first reading signal according to a comparison result during the first read operation, the sense amplifier circuit being configured to compare a current passing through a selected bit line to the first reference current during a second read operation of the second memory cell selected from the second cell array, the sense amplifier circuit being configured to output a second reading signal according to a comparison result during the second read operation; and
a control circuit that controls the first and second reference-current setting circuits,
wherein the control circuit selects, as the first reference cell, the first memory cell being capable of passing a minimum reading current supplied by turning on the first select transistor,
the control circuit selects, as the second reference cell, the second memory cell being capable of passing a minimum reading current supplied by turning on the second select transistor,
the first reference-current setting circuit sets, as the first reference current, a current obtained by subtracting a first adjusting current from the reading current of the first reference cell, and the second reference-current setting circuit sets, as the second reference current, a current obtained by subtracting a second adjusting current from the reading current of the second reference cell.

8. The semiconductor memory device according to claim 7, further comprising a variable current generating circuit that outputs a comparison current,
   wherein the control circuit causes the sense amplifier circuit to compare the comparison current and a reading current supplied by turning on the first select transistor, in a state in which the resistance values of the first memory cells are all reduced, and selects the first memory cell having the minimum reading current as the first reference cell from the first cell array based on the comparison result, and
   the control circuit causes the sense amplifier circuit to compare the comparison current and a reading current supplied by turning on the second select transistor, in a state in which the resistance values of the second memory cells are all reduced, and selects the second memory cell having the minimum reading current as the second reference cell from the second cell array based on the comparison result.

9. The semiconductor memory device according to claim 7, wherein,
   in a case where a first polarity current of at least a first inversion threshold current to pass through the variable resistance element, the variable resistance element has a first resistance value, and
   in a case where a second polarity current of at least a second inversion threshold current passes through the variable resistance element and the second polarity that is different from the first polarity, the variable resistance element has a second resistance value.

10. The semiconductor memory device according to claim 8, the sense amplifier circuit is connected to the first reference-current setting circuit, the second reference-current setting circuit, and the variable current generating circuit.

11. The semiconductor memory device according to claim 10, wherein the variable resistance element is an MTJ element.

12. The semiconductor memory device according to claim 7,
   wherein the first select transistor has a gate connected to a word line, has a first end connected to a first end of the first variable resistance element, and has a second end connected to a first bit line,
   wherein the second select transistor has a gate connected to the word line, has a first end connected to a first end of the second variable resistance element, and has a second end connected to a second bit line, and
   wherein a second end of the first variable resistance element and a second end of the second variable resistance element are connected to a third bit line.

13. A semiconductor memory device comprising:
   a first cell array including first memory cells arranged in a matrix, the first memory cell having a first variable resistance element and a first select transistor;
   a second array including second memory cells arranged in a matrix, the second memory cell having a second variable resistance element and a second select transistor;
   a first reference-current setting circuit configured to output a first reference current;
   a second reference-current setting circuit configured to output a second reference current;
   a sense amplifier circuit configured to compare a current passing through a selected bit line to the second reference current during a first read operation of the first memory cell selected from the first cell array, the sense amplifier circuit being configured to output a first reading signal according to a comparison result during the first read operation; and
   a control circuit that controls the first and second reference-current setting circuits,
   wherein the first reference-current setting circuit sets, as the first reference current, a current between a first reading current of the first memory cell having a maximum reading current and a second reading current of the first memory cell having a minimum reading current, the maximum reading current being a current supplied by turning on the first select transistor in a state in which resistance values of all of the first memory cells are all increased, and the minimum reading current being a current supplied by turning on the first select transistor in a state in which resistance values of all of the first memory cells are all reduced, and
   the second reference-current setting circuit sets, as the second reference current, a current between a third reading current of the second memory cell having a maximum reading current and a fourth reading current of the second memory cell having a minimum reading current, the maximum reading current being a current supplied by turning on the second select transistor in a state in which resistance values of all of the second memory cells are all increased, and the minimum reading current being a current supplied by turning on the second select transistor in a state in which resistance values of all of the second memory cells are all reduced.

14. The semiconductor memory device according to claim 13, wherein
   the first reference-current setting circuit sets the first reference current based on a ratio of a first standard deviation of the distribution of the first reading currents and a second standard deviation of the distribution of the second reading currents, and
   the second reference-current setting circuit sets the second reference current based on a ratio of a third standard deviation of the distribution of the third reading currents and a fourth standard deviation of the distribution of the fourth reading currents.

15. The semiconductor memory device according to claim 14, wherein a ratio of a difference between the first reference current and the first reading current and a difference between the first reference current and the second reading current is equal to a ratio of the first standard deviation and the second standard deviation.

16. The semiconductor memory device according to claim 13, wherein,
   in a case where a first polarity current of at least a first inversion threshold current to pass through the variable resistance element, the variable resistance element has a first resistance value, and
   in a case where a second polarity current of at least a second inversion threshold current passes through the variable resistance element and the second polarity that is different from the first polarity, the variable resistance element has a second resistance value.

17. The semiconductor memory device according to claim 13, wherein the sense amplifier circuit is connected to the first reference-current setting circuit and the second reference-current setting circuit.

18. The semiconductor memory device according to claim 17, wherein the variable resistance element is an MTJ element.

19. The semiconductor memory device according to claim 13,
 wherein the first select transistor has a gate connected to a word line, has a first end connected to a first end of the first variable resistance element, and has a second end connected to a first bit line,
 wherein the second select transistor has a gate connected to the word line, has a first end connected to a first end of the second variable resistance element, and has a second end connected to a second bit line, and
 wherein a second end of the first variable resistance element and a second end of the second variable resistance element are connected to a third bit line.

\* \* \* \* \*